US012656902B2

(12) United States Patent　　(10) Patent No.: US 12,656,902 B2

Kim et al.　　(45) Date of Patent: Jun. 16, 2026

(54) DISPLAY APPARATUS AND METHOD OF DRIVING THE SAME

(71) Applicant: Samsung Display Co., Ltd., Yongin-Si (KR)

(72) Inventors: Siwoo Kim, Yongin-si (KR); Taeho Kang, Yongin-si (KR); Haeryeong Park, Yongin-si (KR); Gunwoo Yang, Yongin-si (KR); Keunhee Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/943,905

(22) Filed: Nov. 12, 2024

(65) Prior Publication Data

US 2025/0173023 A1　May 29, 2025

(30) Foreign Application Priority Data

Nov. 24, 2023　(KR) ........................ 10-2023-0166044

(51) Int. Cl.
| | |
|---|---|
| *G06F 3/041* | (2006.01) |
| *G06F 3/044* | (2006.01) |
| *G09G 3/20* | (2006.01) |
| *H10K 59/40* | (2023.01) |

(52) U.S. Cl.
CPC ........ *G06F 3/04166* (2019.05); *G06F 3/0412* (2013.01); *G06F 3/0445* (2019.05); *G06F 3/0446* (2019.05); *G09G 3/20* (2013.01); *G09G 2310/0267* (2013.01); *G09G 2310/08* (2013.01); *G09G 2354/00* (2013.01); *H10K 59/40* (2023.02)

(58) Field of Classification Search
CPC ........ G06F 3/41–047; G06F 2203/041–04114; G06F 3/04166; G06F 3/0412; G06F 3/041661; G06F 3/044; G06F 3/0443; G06F 4/0445; G06F 3/0446; H10K 59/40
See application file for complete search history.

(56) References Cited

U.S. PATENT DOCUMENTS

| | | | |
|---|---|---|---|
| 9,552,103 B2 | 1/2017 | Craven-Bartle et al. | |
| 2016/0342233 A1* | 11/2016 | Lee | ........................ G06F 3/0443 |
| 2021/0333940 A1* | 10/2021 | Liu | ........................ G06F 3/0443 |

(Continued)

FOREIGN PATENT DOCUMENTS

| | | |
|---|---|---|
| KR | 10-2021-0153392 A | 12/2021 |
| KR | 10-2022-0085864 A | 6/2022 |

*Primary Examiner* — Sanjiv D. Patel

(74) *Attorney, Agent, or Firm* — Innovation Counsel LLP

(57) ABSTRACT

A display apparatus includes a display panel, a gate driver, a data driver, a first touch layer, a second touch layer and a touch driver. The gate driver is configured to output gate signals to the display panel. The data driver is configured to output data voltages to the display panel. The first touch layer is disposed adjacent to the display panel and includes a plurality of first touch electrodes. The second touch layer is disposed adjacent to the display panel and includes a plurality of second touch electrodes. The touch driver is configured to output touch driving signals to the plurality of first touch electrodes. When first gate pulses are applied to a first gate line group of the display panel, a first touch driving signal applied to a 1-1 touch electrode overlapping the first gate line group among the plurality of first touch electrodes has a discharging period.

18 Claims, 13 Drawing Sheets

(56)         References Cited

U.S. PATENT DOCUMENTS

2022/0057898 A1*    2/2022   Lee ....................... G06F 3/0412
2022/0187979 A1     6/2022   Jung et al.
2023/0114167 A1     4/2023   Oh et al.

* cited by examiner

FIG. 2

SECOND TOUCH LAYER 620

DISPLAY PANEL 100

FIRST TOUCH LAYER 610

2000

DISPLAY PANEL DRIVER(110)

TOUCH DRIVER(600)

| LUMINANCE DIFFERENCE | COMPARATIVE EMBODIMENT | PRESENT EMBODIMENT |
|---|---|---|
| TOTAL | 30.8% | 1.8% |
| AMPLITUDE | 2.7% | 1.8% |
| PHASE DIFFERENCE | 28.1% | 0% |

DISPLAY APPARATUS AND METHOD OF DRIVING THE SAME

PRIORITY STATEMENT

This application claims priority under 35 U.S.C. § 119 to Korean Patent Application No. 10-2023-0166044, filed on Nov. 24, 2023 in the Korean Intellectual Property Office KIPO, the contents of which are herein incorporated by reference in their entireties.

BACKGROUND

1. Field

Embodiments of the present inventive concept relate to a display apparatus and a method of driving the display apparatus. More particularly, embodiments of the present inventive concept relate to a display apparatus enhancing a display quality of a display panel by overlapping a gate pulse applying period of a gate signal and a discharging period of a touch driving signal in a corresponding area and a method of driving the display apparatus.

2. Description of the Related Art

Generally, a display apparatus includes a display panel and a display panel driver. The display panel displays an image based on input image data. The display panel includes a plurality of gate lines, a plurality of data lines and a plurality of pixels. The display panel driver includes a gate driver, a data driver and a driving controller. The gate driver outputs gate signals to the gate lines. The data driver outputs data voltages to the data lines. The driving controller controls an operation of the gate driver and an operation of the data driver.

A display apparatus may further include a touch panel recognizing a touch of a touch element. A touch driving signal for operating the touch panel and the data voltage of the display panel may be coupled. A degree of coupling between the touch driving signal and the data voltage may vary according to a position in the display panel by a waveform of the touch driving signal. When the degree of the coupling between the touch driving signal and the data voltage varies according to the position in the display panel, a horizontal line defect or a stain may be shown to a user on the display panel.

In addition, when a capacitance between a touch electrode and a gate electrode of a driving switching element of the pixel is different from a capacitance between the touch electrode and a source electrode of the driving switching element of the pixel, a luminance difference may be generated between the pixels so that a flicker may be shown to the user.

SUMMARY

Embodiments of the present inventive concept provide a display apparatus enhancing a display quality of a display panel by overlapping a gate pulse applying period of a gate signal and a discharging period of a touch driving signal in a corresponding area.

Embodiments of the present inventive concept also provide a method of driving the display apparatus.

In an embodiment of a display apparatus according to the present inventive concept, the display apparatus includes a display panel, a gate driver, a data driver, a first touch layer, a second touch layer and a touch driver. The gate driver is configured to output gate signals to the display panel. The data driver is configured to output data voltages to the display panel. The first touch layer is disposed adjacent to the display panel and includes a plurality of first touch electrodes. The second touch layer is disposed adjacent to the display panel and includes a plurality of second touch electrodes. The touch driver is configured to output touch driving signals to the plurality of first touch electrodes. When first gate pulses are applied to a first gate line group of the display panel, a first touch driving signal applied to a 1-1 touch electrode overlapping the first gate line group among the plurality of first touch electrodes has a discharging period.

In an embodiment, when second gate pulses are applied to a second gate line group of the display panel which is adjacent to the first gate line group, a second touch driving signal applied to a 1-2 touch electrode overlapping the second gate line group among the plurality of first touch electrodes may have a discharging period.

In an embodiment, a plurality of gate lines of the display panel may extend in a first direction. The plurality of first touch electrodes may extend in the first direction. Gate pulses may be sequentially applied to the plurality of gate lines along a second direction. The touch driving signals may be sequentially applied to the plurality of first touch electrodes along the second direction.

In an embodiment, a plurality of data lines of the display panel may extend in the second direction. The plurality of second touch electrodes may extend in the second direction.

In an embodiment, the touch driving signals may periodically have a charging period and a discharging period.

In an embodiment, the gate signals and the touch driving signals may be synchronized with each other based on a vertical start signal.

In an embodiment, the display apparatus may further include a driving controller configured to control the gate driver and the data driver. The driving controller may be configured to output the vertical start signal to the gate driver and the touch driver.

In an embodiment, the first gate pulses may be applied to the first gate line group in a first scanning period. Second gate pulses may be applied to a second gate line group adjacent to the first gate line group in a second scanning period. Third gate pulses may be applied to a third gate line group adjacent to the second gate line group in a third scanning period. Fourth gate pulses may be applied to a fourth gate line group adjacent to the third gate line group in a fourth scanning period. In the first scanning period, the first touch driving signal applied to the 1-1 touch electrode overlapping the first gate line group may have a discharging period, a second touch driving signal applied to a 1-2 touch electrode overlapping the second gate line group may have a charging period, a third touch driving signal applied to a 1-3 touch electrode overlapping the third gate line group may have a discharging period and a fourth touch driving signal applied to a 1-4 touch electrode overlapping the fourth gate line group may have a charging period. In the second scanning period, the first touch driving signal may have a charging period, the second touch driving signal may have a discharging period, the third touch driving signal may have a charging period and the fourth touch driving signal may have a discharging period. In the third scanning period, the first touch driving signal may have a discharging period, the second touch driving signal may have a charging period, the third touch driving signal may have a discharging period and the fourth touch driving signal may have a charging period. In the fourth scanning period, the first touch driving signal may have a charging period, the second touch driving signal may have a discharging period, the third touch driving signal may have a charging period and the fourth touch driving signal may have a discharging period.

In an embodiment, the first gate pulses may be applied to the first gate line group in a first scanning period. Second gate pulses may be applied to a second gate line group adjacent to the first gate line group in a second scanning period. Third gate pulses may be applied to a third gate line group adjacent to the second gate line group in a third scanning period. Fourth gate pulses may be applied to a fourth gate line group adjacent to the third gate line group in a fourth scanning period. In the first scanning period, the first touch driving signal applied to the 1-1 touch electrode overlapping the first gate line group may have a discharging period, a second touch driving signal applied to a 1-2 touch electrode overlapping the second gate line group may have a charging period, a third touch driving signal applied to a 1-3 touch electrode overlapping the third gate line group may have a charging period and a fourth touch driving signal applied to a 1-4 touch electrode overlapping the fourth gate line group may have a discharging period. In the second scanning period, the first touch driving signal may have a discharging period, the second touch driving signal may have a discharging period, the third touch driving signal may have a charging period and the fourth touch driving signal may have a charging period. In the third scanning period, the first touch driving signal may have a charging period, the second touch driving signal may have a discharging period, the third touch driving signal may have a discharging period and the fourth touch driving signal may have a charging period. In the fourth scanning period, the first touch driving signal may have a charging period, the second touch driving signal may have a charging period, the third touch driving signal may have a discharging period and the fourth touch driving signal may have a discharging period.

In an embodiment, the first gate pulses may be applied to the first gate line group in a first scanning period. Second gate pulses may be applied to a second gate line group adjacent to the first gate line group in a second scanning period. Third gate pulses may be applied to a third gate line group adjacent to the second gate line group in a third scanning period. Fourth gate pulses may be applied to a fourth gate line group adjacent to the third gate line group in a fourth scanning period. In the first scanning period, the first touch driving signal applied to the 1-1 touch electrode overlapping the first gate line group may have a discharging period, a second touch driving signal applied to a 1-2 touch electrode overlapping the second gate line group may have a discharging period, a third touch driving signal applied to a 1-3 touch electrode overlapping the third gate line group may have a charging period and a fourth touch driving signal applied to a 1-4 touch electrode overlapping the fourth gate line group may have a charging period. In the second scanning period, the first touch driving signal may have a charging period, the second touch driving signal may have a discharging period, the third touch driving signal may have a discharging period and the fourth touch driving signal may have a charging period. In the third scanning period, the first touch driving signal may have a charging period, the second touch driving signal may have a charging period, the third touch driving signal may have a discharging period and the fourth touch driving signal may have a discharging period. In the fourth scanning period, the first touch driving signal may have a discharging period, the second touch driving signal may have a charging period, the third touch driving signal may have a charging period and the fourth touch driving signal may have a discharging period.

In an embodiment, the display panel may be disposed on the first touch layer. The second touch layer may be disposed on the display panel. When a touch element contacts the second touch layer, a touch event may be generated.

In an embodiment of a display apparatus according to the present inventive concept, the display apparatus includes a display panel, a first touch layer, a second touch layer and a touch driver. The display panel includes a driving switching element. The first touch layer is disposed adjacent to the display panel and including a plurality of first touch electrodes. The second touch layer is disposed adjacent to the display panel and including a plurality of second touch electrodes. The touch driver is configured to output touch driving signals to the plurality of first touch electrodes. A first ratio of a total capacitance of a gate electrode of the driving switching element and a capacitance between a first touch electrode of the plurality of first touch electrodes and the gate electrode is substantially the same as a second ratio of a total capacitance of a source electrode of the driving switching element and a capacitance between the first touch electrode and the source electrode.

In an embodiment, the display apparatus may further include a gate driver configured to output gate signals to the display panel and a data driver configured to output data voltages to the display panel. When first gate pulses are applied to a first gate line group of the display panel, a first touch driving signal applied to a 1-1 touch electrode overlapping the first gate line group among the plurality of first touch electrodes has a discharging period.

In an embodiment, when second gate pulses are applied to a second gate line group of the display panel which is adjacent to the first gate line group, a second touch driving signal applied to a 1-2 touch electrode overlapping the second gate line group among the plurality of first touch electrodes may have a discharging period.

In an embodiment, a plurality of gate lines of the display panel may extend in a first direction. The plurality of first touch electrodes may extend in the first direction. Gate pulses may be sequentially applied to the plurality of gate lines along a second direction. The touch driving signals may be sequentially applied to the plurality of first touch electrodes along the second direction.

In an embodiment, the display panel may be disposed on the first touch layer. The second touch layer may be disposed on the display panel. When a touch element contacts the second touch layer, a touch event may be generated.

In an embodiment of a method of driving a display apparatus according to the present inventive concept, the method includes outputting gate signals to a display panel, outputting data voltages to the display panel and outputting touch driving signals to a plurality of first touch electrodes of a first touch layer disposed adjacent to the display panel. When first gate pulses are applied to a first gate line group of the display panel, a first touch driving signal applied to a 1-1 touch electrode overlapping the first gate line group among the plurality of first touch electrodes has a discharging period.

In an embodiment, when second gate pulses are applied to a second gate line group of the display panel which is adjacent to the first gate line group, a second touch driving signal applied to a 1-2 touch electrode overlapping the second gate line group among the plurality of first touch electrodes may have a discharging period.

In an embodiment, a plurality of gate lines of the display panel may extend in a first direction. The plurality of first touch electrodes may extend in the first direction. Gate pulses may be sequentially applied to the plurality of gate lines along a second direction. The touch driving signals may be sequentially applied to the plurality of first touch electrodes along the second direction.

In an embodiment, the gate signals and the touch driving signals may be synchronized with each other based on a vertical start signal.

According to the display apparatus and the method of driving the display apparatus, the horizontal line defect of the display panel and the stain of the display panel may be reduced by overlapping the gate pulse applying period of the gate signal and the discharging period of the touch driving signal in the corresponding area. Thus, the display quality of the display panel may be enhanced.

In addition, the flicker of the display panel may be reduced by matching the ratio of the capacitance between the gate electrode of the driving switching element of the pixel and the first touch electrode to the total capacitance of the gate electrode of the driving switching element of the pixel and the ratio of the capacitance between the source electrode of the driving switching element of the pixel and the first touch electrode to the total capacitance of the source electrode of the driving switching element of the pixel. Thus, the display quality of the display panel may be enhanced.

BRIEF DESCRIPTION OF THE DRAWINGS

The above and other features and advantages of the present inventive concept will become more apparent by describing in detailed embodiments thereof with reference to the accompanying drawings.

FIG. 2 is a block diagram illustrating a display panel, a display panel driver, a first touch layer, a second touch layer and a touch driver of the display apparatus of FIG. 1.

FIG. 3 is a diagram illustrating first touch electrodes of the first touch layer of FIG. 2 and second touch electrodes of the second touch layer of FIG. 2.

DETAILED DESCRIPTION OF THE INVENTIVE CONCEPT

Hereinafter, the present inventive concept will be explained in detail with reference to the accompanying drawings.

Figure 1:
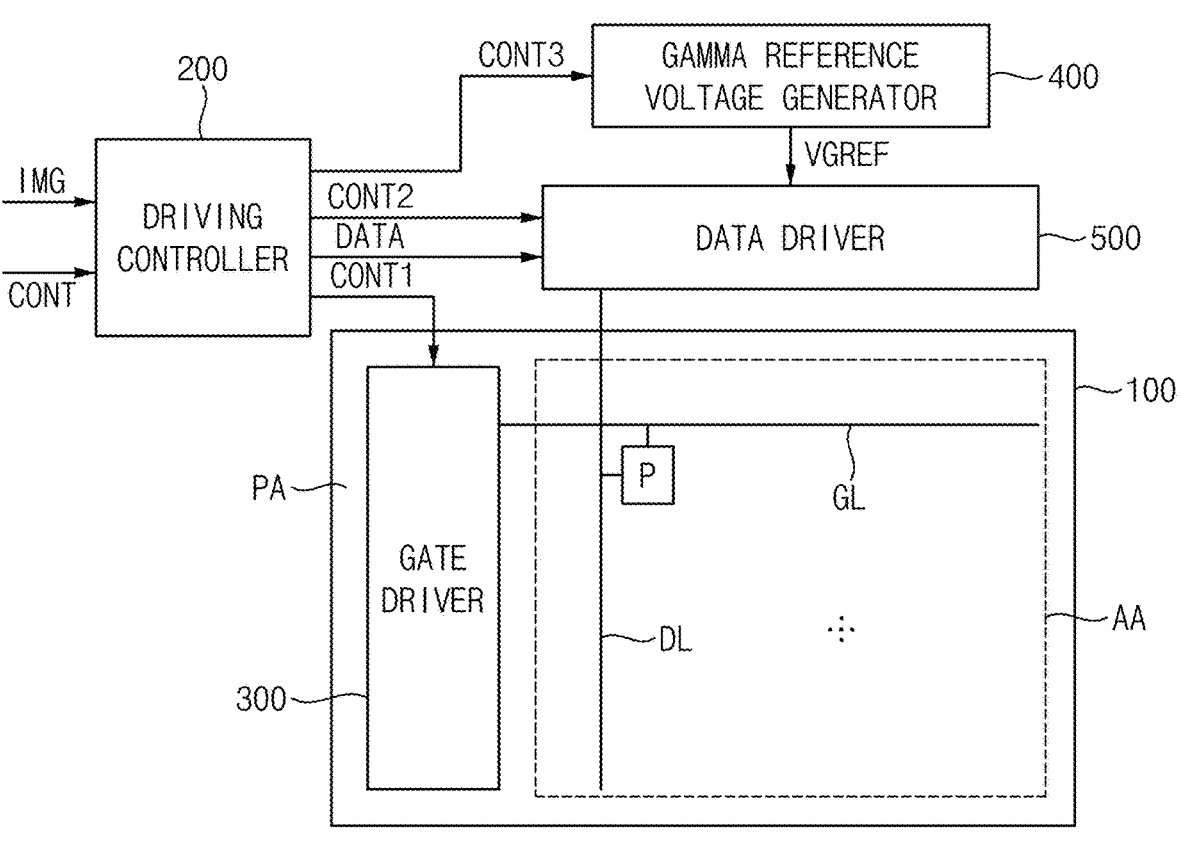
FIG. 1 is a block diagram illustrating a display apparatus according to an embodiment of the present inventive concept.
Figure 1:
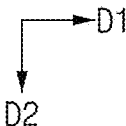

FIG. 1 is a block diagram illustrating a display apparatus according to an embodiment of the present inventive concept.

Referring to FIG. 1, the display apparatus includes a display panel 100 and a display panel driver. The display panel driver drives the display panel 100. The display panel driver includes a driving controller 200, a gate driver 300, a gamma reference voltage generator 400 and a data driver 500.

For example, the driving controller 200 and the data driver 500 may be integrally formed. For example, the driving controller 200, the gamma reference voltage generator 400 and the data driver 500 may be integrally formed. A driving module including at least the driving controller 200 and the data driver 500 which are integrally formed may be called a timing controller embedded data driver (TED).

The display panel 100 has a display region AA on which an image is displayed and a peripheral region PA adjacent to the display region AA.

The display panel 100 includes a plurality of gate lines GL, a plurality of data lines DL and a plurality of pixels P connected to the gate lines GL and the data lines DL. The gate lines GL may extend in a first direction D1 and the data lines DL may extend in a second direction D2 crossing the first direction D1.

The driving controller 200 receives input image data IMG and an input control signal CONT from an external apparatus (e.g. an application processor). For example, the input image data IMG may include red image data, green image data and blue image data. For example, the input image data IMG may include white image data. For example, the input image data IMG may include magenta image data, yellow image data and cyan image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the driving controller 200. The gate driver 300 outputs the gate signals to the gate lines GL. For example, the gate driver 300 may sequentially output the gate signals to the gate lines GL. For example, the gate driver 300 may be mounted on the peripheral region PA of the display panel 100. For example, the gate driver 300 may be integrated on the peripheral region PA of the display panel 100.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500.

In an embodiment, the gamma reference voltage generator 400 may be disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

Figure 2:
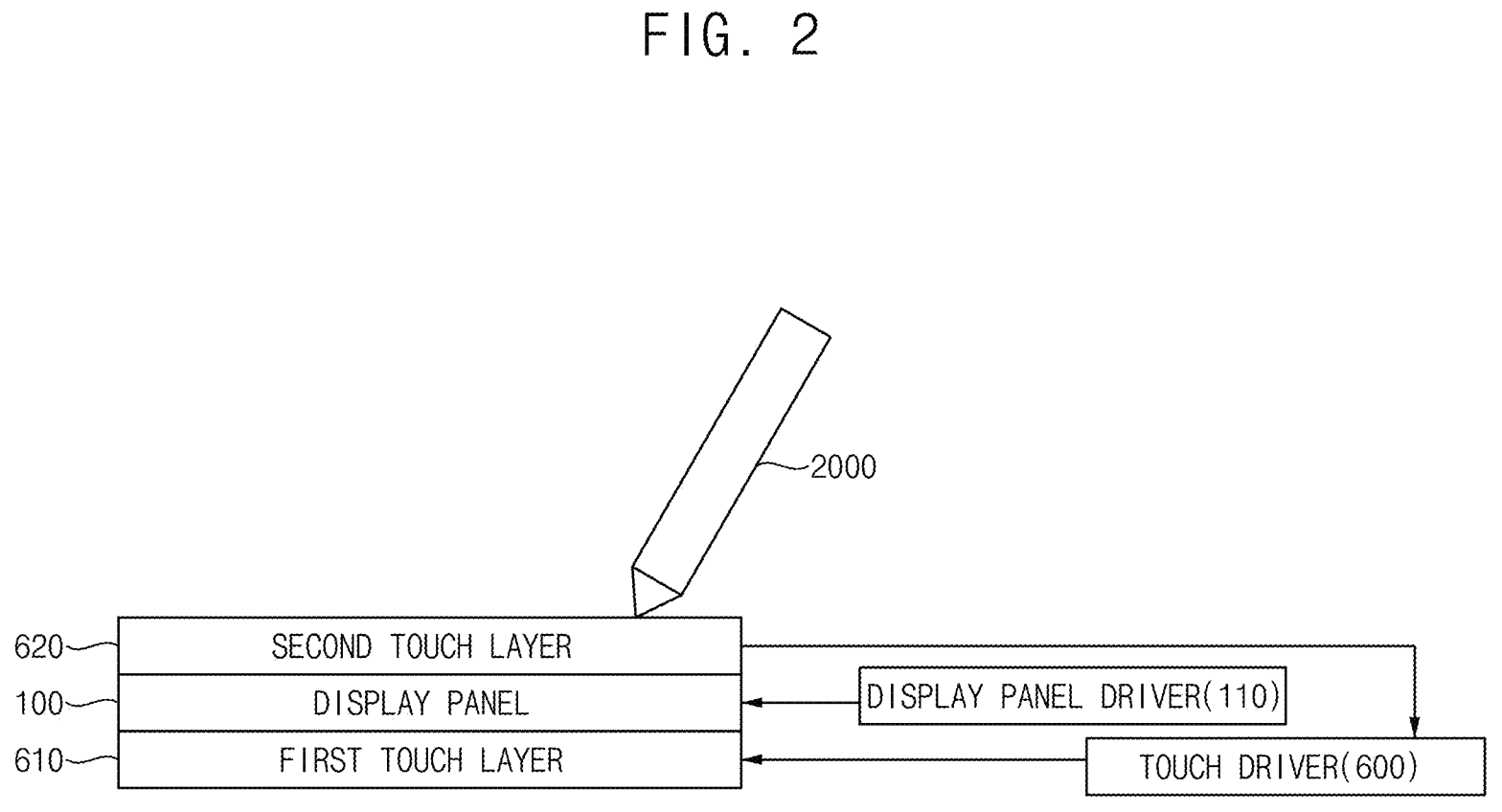
Figure 3:
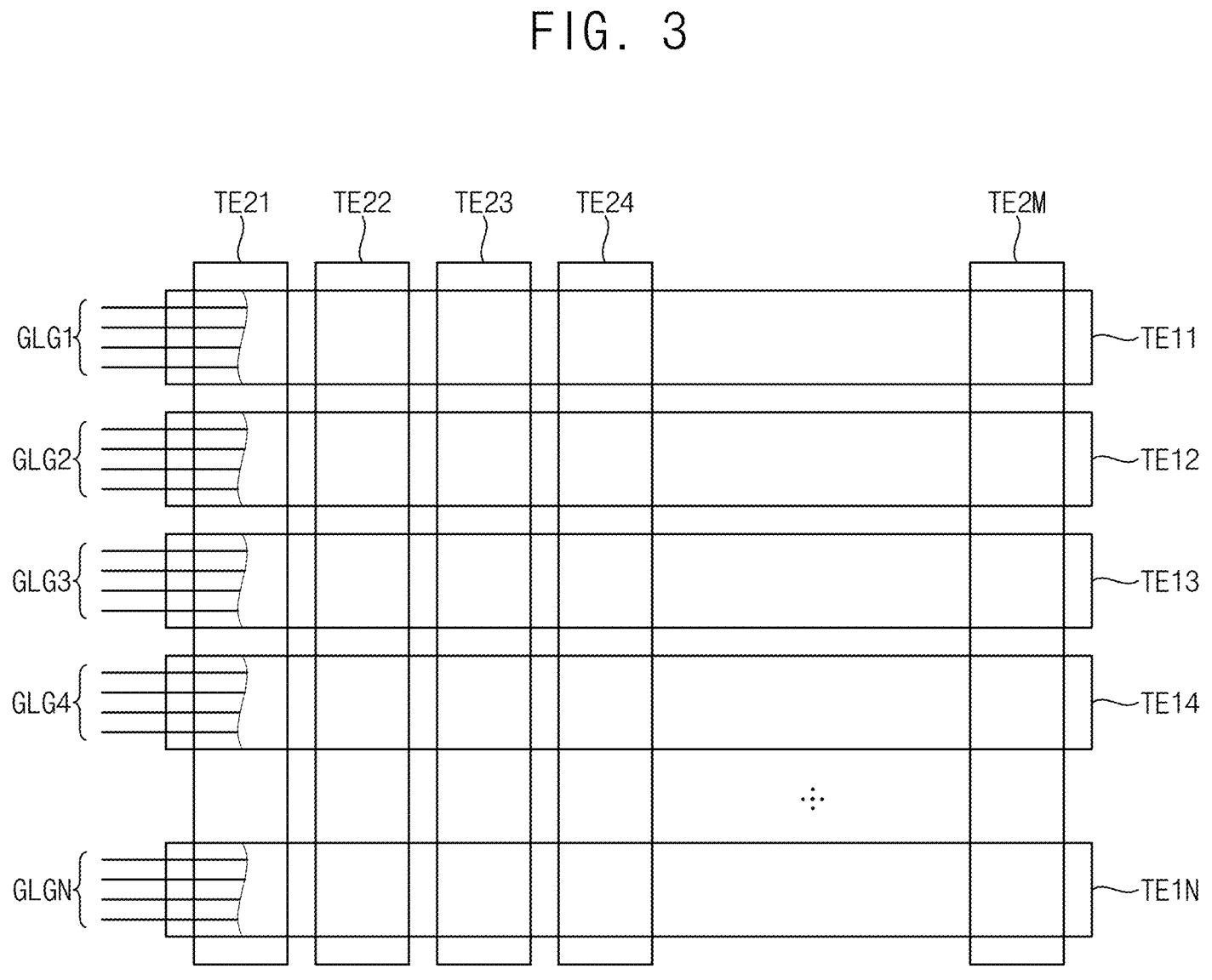
Figure 4:
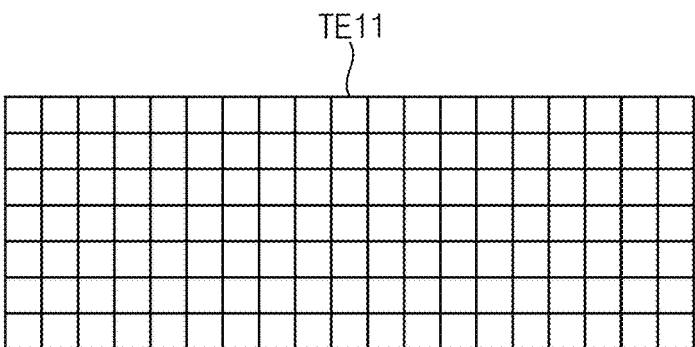
FIG. 4 is a diagram illustrating a 1-1 touch electrode of FIG. 3.
Figure 5:
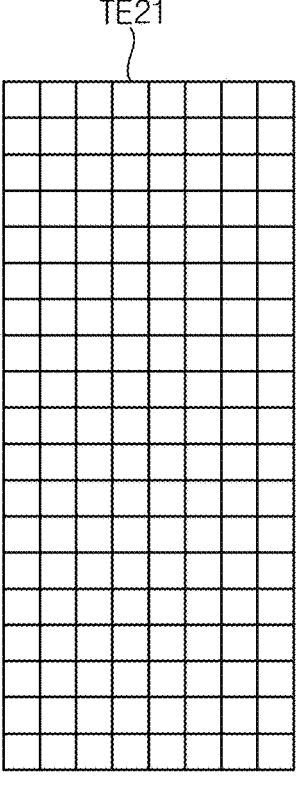
FIG. 5 is a diagram illustrating a 2-1 touch electrode of FIG. 3.

FIG. 2 is a block diagram illustrating the display panel 100, a display panel driver 110, a first touch layer 610, a second touch layer 620 and a touch driver 600 of the display apparatus of FIG. 1. FIG. 3 is a diagram illustrating first touch electrodes TE11, TE12, TE13, TE14, ..., TE1N of the first touch layer 610 of FIG. 2, second touch electrodes TE21, TE22, TE23, TE24, ..., TE2M of the second touch layer 620 of FIG. 2, and gate line groups GLG1, GLG2, GLG3, GLG4, ..., GLGN of the display panel 100 of FIG. 2. FIG. 4 is a diagram illustrating the 1-1 touch electrode TE11 of FIG. 3. FIG. 5 is a diagram illustrating the 2-1 touch electrode TE21 of FIG. 3.

Referring to FIGS. 1 to 5, the display apparatus may include the display panel driver 110, the touch driver 600, the first touch layer 610, the display panel 100 and the second touch layer 620.

In the present embodiment, the display panel 100 may be disposed on the first touch layer 610. The second touch layer 620 may be disposed on the display panel 100. When a touch element 2000 contacts the second touch layer 620, a touch event may be generated. When the touch element 2000 contacts the second touch layer 620, the touch element 2000 may be charged. In addition, when the touch element 2000 contacts the second touch layer 620, a touch position of the touch element 2000 may be sensed by the touch driver 600.

The touch element 2000 may be charged in response to the touch driving signal. The touch element 2000 may output a touch element output signal in response to the touch driving signal.

In an embodiment, the touch element 2000 may have a pen shape. A pen electrode may be disposed an end portion of the touch element 2000. For example, a portion of the pen electrode may be exposed to an outside of the touch element 2000 and a remaining portion of the pen electrode may be disposed inside the touch element 2000. For example, the touch element 2000 may be one of a stylus pen, an active pen, a touch pen and an electronic pen.

The second touch layer 620 may receive the touch element output signal from the touch element 2000. The second touch layer 620 may output touch element sensing information to the touch driver 600. For example, the touch element sensing information may include coordinates of a position of the touch element 2000 on the second touch layer 620. In an embodiment, the touch driving signal may not be applied to a touch driving line in a period when the second touch layer 620 receives the touch element output signal. For example, a voltage of the touch driving line may be a direct-current (DC) voltage of 0V in the period when the second touch layer 620 receives the touch element output signal.

The first touch layer 610 may receive the touch driving signal from the touch driver 600. The first touch layer 610 may include the first touch electrodes TE11, TE12, ..., TE1N.

The gate lines GL of the display panel 100 may extend in the first direction D1 and the first touch electrodes TE11, TE12, ..., TE1N may extend in the first direction D1. The first touch electrodes TE11, TE12, ..., TE1N may be disposed in the second direction D2.

The touch driving signals may be applied to the first touch electrodes TE11, TE12, ..., TE1N.

Gate pulses may be sequentially applied to the gate lines GL along the second direction D2 and the touch driving signals may be sequentially applied to the first touch electrodes TE11, TE12, ..., TE1N along the second direction D2

In contrast, the data lines DL of the display panel 100 may extend in the second direction D2 and the second touch electrodes TE21, TE22, TE23, TE24, ..., TE2M may extend in the second direction D2. The second touch electrodes TE21, TE22, TE23, TE24, ..., TE2M may be disposed in the first direction D1.

As shown in FIG. 4, the 1-1 touch electrode TE11 has a mesh shape. For example, the 1-1 touch electrode TE11 may include a plurality of first extension portions extending in the first direction D1 and a plurality of second extension portions extending in the second direction D2. The first extension portions and the second extension portions of the 1-1 touch electrode TE11 may connected to each other at crossing points of the first extension portions and the second extension portions. Although not shown in figures, each of the first touch electrodes TE11, TE12, ..., TE1N may have a mesh shape.

As shown in FIG. 5, the 2-1 touch electrode TE21 has a mesh shape. For example, the 2-1 touch electrode TE21 may include a plurality of first extension portions extending in the first direction D1 and a plurality of second extension portions extending in the second direction D2. The first extension portions and the second extension portions of the 2-1 touch electrode TE21 may connected to each other at crossing points of the first extension portions and the second extension portions. Although not shown in figures, each of the second touch electrodes TE21, TE22, TE23, TE24, . . . , TE2M may have a mesh shape.

Figure 6:
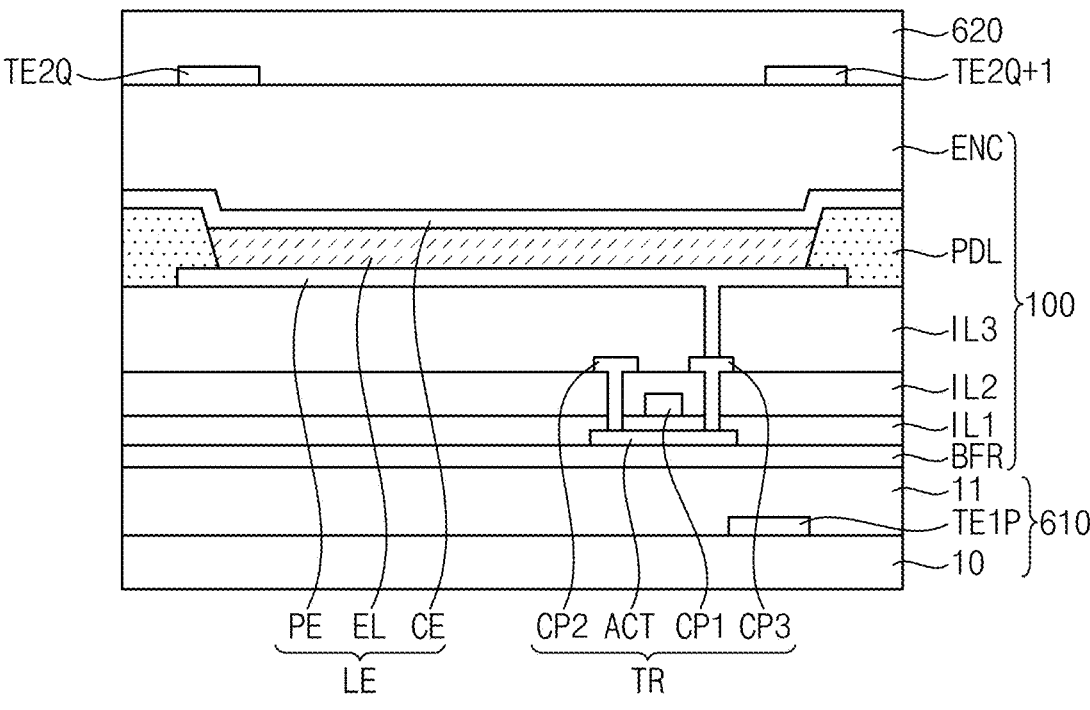
FIG. 6 is a cross-sectional view illustrating the first touch layer, the display panel and the second touch layer of FIG. 2.

FIG. 6 is a cross-sectional view illustrating the first touch layer 610, the display panel 100 and the second touch layer 620 of FIG. 2.

Referring to FIGS. 1 to 6, the first touch layer 610 may include the first touch electrode TE1P, a first base layer 10, and a second base layer 11. The first touch electrode TE1P may be disposed on the first base layer 10. The second base layer 11 may be disposed on the first touch electrode TE1P. The second base layer 11 may be disposed on the first base layer 10. The display panel 100 may be disposed on the second base layer 11. The second touch layer 620 may be disposed on the display panel 100.

In the present embodiment, the first base layer 10 and the second base layer 11 may include an organic material with a high heat resistance and a high durability such as poly-imide, polyethylene naphthalate, polyethylene terephthalate (PET), polyarylate, polycarbonate, polyetherimide (PEI) or polyethersulfone.

In an embodiment, the display panel 100 may include a buffer layer BFR, first to third insulation layers IL1, IL2 and IL3, an active pattern ACT, first to third conductive patterns CP1, CP2 and CP3, a pixel defining layer PDL, a light emitting element LE and an encapsulation layer ENC. The active pattern ACT and the first to third conductive patterns CP1, CP2 and CP3 may form a transistor TR. The light emitting element LE may include a pixel electrode PE, a light emitting layer EL and a common electrode CE.

The buffer layer BFR may be disposed on the second base layer 11. The buffer layer BFR may prevent impurities such as oxygen and water from diffusing into an upper part of the second base layer 11. The buffer layer BFR may include an inorganic insulating material such as a silicon compound or metal oxide.

The active pattern ACT may be disposed on the buffer layer BFR. In an embodiment, the active pattern ACT may include a silicon semiconductor material or an oxide semi-conductor material.

In an embodiment, the first insulation layer IL1 may be disposed on the buffer layer BFR. The first insulation layer IL1 may cover the active pattern ACT. In an embodiment, the first insulation layer IL1 may be dispose as a pattern on the active pattern ACT to expose a portion of the active pattern ACT. For example, the first insulation layer IL1 may be dispose as a pattern on the active pattern ACT to overlap the first conductive pattern CP1. The first insulation layer IL1 may include an inorganic insulating material.

The first conductive pattern CP1 may be disposed on the first insulation layer IL1. In an embodiment, the first con-ductive pattern CP1 may include at least one of metal, alloy, conductive metal oxides and a transparent conductive mate-rial.

The second insulation layer IL2 may be disposed on the first insulation layer IL1. In an embodiment, the second insulation layer IL2 may cover the first conductive pattern CP1. The second insulation layer IL2 may include an inorganic insulating material.

The second conductive pattern CP2 and the third conduc-tive pattern CP3 may be disposed on the second insulation layer IL2. The second conductive pattern CP2 and the third conductive pattern CP3 may be electrically connected to the active pattern ACT through a contact hole formed in the second insulation layer IL2. The second conductive pattern CP2 and the third conductive pattern CP3 may include at least one of metal, alloy, conductive metal oxides and a transparent conductive material.

For example, the first conductive pattern CP1 may be a gate electrode of the transistor TR (e.g. the driving switching element of the pixel). For example, the second conductive pattern CP2 may be a source electrode of the transistor TR (e.g. the driving switching element of the pixel). For example, the third conductive pattern CP3 may be a drain electrode of the transistor TR (e.g. the driving switching element of the pixel).

The third insulation layer IL3 may be disposed on the second insulation layer IL2. For example, the third insula-tion layer IL3 may cover the second conductive pattern CP2 and the third conductive pattern CP3. The third insulation layer IL3 may include an inorganic insulating material.

The configuration, arrangement, and connection structure of the transistor TR and the plurality of insulation layers IL1, IL2, and IL3 shown in FIG. 6 are exemplary and may be changed in various ways. For example, the transistor TR may have a double-gate structure further including a fourth conductive pattern.

The pixel electrode PE may be disposed on the third insulation layer IL3. The pixel electrode PE may be elec-trically connected to the transistor TR through a contact hole formed in the third insulation layer IL3. In an embodiment, the pixel electrode PE may include at least one of metal, alloy, conductive metal oxides and a transparent conductive material.

The pixel defining layer PDL may be disposed on the third insulation layer IL3 and the pixel electrode PE. The pixel defining layer PDL may include an organic insulating mate-rial. In an embodiment, the pixel defining layer PDL further include a light blocking material. Examples of the light blocking material of the pixel defining layer PDL may be a black pigment, a black dye and so on.

The pixel defining layer PDL may cover an edge of the pixel electrode PE and expose a portion of the pixel elec-trode PE.

The light emitting element LE may include the pixel electrode PE, the light emitting layer EL and the common electrode CE.

In an embodiment, the light emitting layer EL may include a light emitting material. For example, the light emitting layer EL may include an organic light emitting material. In an embodiment, functional layers such as a hole injection layer, a hole transport layer, an electron transport layer and an electron injection layer may be additionally disposed on and/or under the light emitting layer EL. The common electrode CE may be disposed on the light emitting layer EL. The common electrode CE may include at least one of metal, alloy, conductive metal oxides and a transpar-ent conductive material. In an embodiment, the common electrode CE may extend continuously across a plurality of the pixels.

The encapsulation layer ENC may be disposed on the light emitting element LE. The encapsulation layer ENC may protect the light emitting element LE from external moisture, heat, shock, etc. Although not shown in figures, the encapsulation layer ENC may include a first inorganic encapsulation layer, an organic encapsulation layer disposed on the first inorganic encapsulation layer and a second inorganic encapsulation layer disposed on the organic encapsulation layer.

For example, the second touch layer 620 may be disposed on the encapsulation layer ENC. In the present embodiment, the second touch layer 620 may include the second touch electrode TE2Q and TE2Q+1. For example, the second touch electrode TE2Q and TE2Q+1 may receive the touch element output signal and output the touch element sensing information to the touch driver 600. The second touch electrode TE2Q and TE2Q+1 may sense the coordinates of the position of the touch element 2000 and output the coordinates of the position to the touch driver 600.

Figure 7:
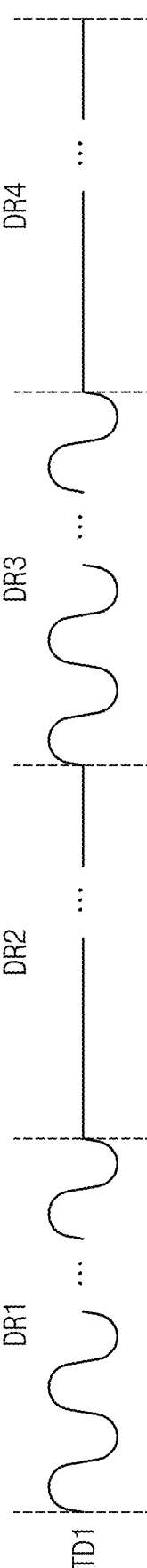
FIG. 7 is a first touch driving signal applied to the 1-1 touch electrode of FIG. 3.

FIG. 7 is a first touch driving signal TD1 applied to the 1-1 touch electrode TE11 of FIG. 3.

Referring to FIGS. 1 to 7, the touch driving signals may periodically have a charging period and a discharging period. The first touch driving signal TD1 may periodically have the charging period DR1 and DR3 and the discharging period DR2 and DR4.

The first touch driving signal TD1 may output a waveform having a periodicity in the charging period DR1 and DR3. For example, the first touch driving signal TD1 may output a sine waveform in the charging period DR1 and DR3. The touch element 2000 may be charged in the charging period DR1 and DR3 by the sine waveform.

The first touch driving signal TD1 may have a direct-current (DC) voltage in the discharging period DR2 and DR4. During the discharging period DR2 and DR4, the touch driver 600 may sense a touch position of the touch element 2000.

Figure 8A:
FIG. 8A is a timing diagram illustrating an example of gate signals applied to gate lines of the display panel of FIG. 2 and touch driving signals applied to the first touch electrodes of FIG. 3.
Figure 8B:
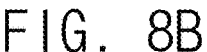
FIG. 8B is a timing diagram illustrating an example of the gate signals applied to the gate lines of the display panel of FIG. 2 and touch driving signals applied to the first touch electrodes of FIG. 3.
Figure 8C:
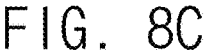
FIG. 8C is a timing diagram illustrating an example of the gate signals applied to the gate lines of the display panel of FIG. 2 and touch driving signals applied to the first touch electrodes of FIG. 3.

FIG. 8A is a timing diagram illustrating an example of gate signals applied to gate lines GL of the display panel 100 of FIG. 2 and touch driving signals applied to the first touch electrodes TE11, TE12, . . . , TE1N of FIG. 3. FIG. 8B is a timing diagram illustrating an example of the gate signals applied to the gate lines GL of the display panel 100 of FIG. 2 and touch driving signals applied to the first touch electrodes TE11, TE12, . . . , TE1N of FIG. 3. FIG. 8C is a timing diagram illustrating an example of the gate signals applied to the gate lines GL of the display panel 100 of FIG. 2 and touch driving signals applied to the first touch electrodes TE11, TE12, . . . , TE1N of FIG. 3.

Referring to FIGS. 1 to 8C, the gate signals and the touch driving signals may be synchronized with each other.

For example, the gate signals and the touch driving signals may be synchronized with each other such that the gate pulse applying period of the gate signal and the discharging period of the touch driving signal are overlapped with each other in the corresponding area.

For example, the gate signals and the touch driving signals may be synchronized with each other based on a vertical start signal. The driving controller 200 may output the vertical start signal to the gate driver 300 and the touch driver 600.

In FIGS. 8A to 8C, first to fourth gate lines to which first to fourth gate signals GW1 to GW4 are applied may be a first gate line group, fifth to eighth gate lines to which fifth to eighth gate signals GW5 to GW8 are applied may be a second gate line group, ninth to twelfth gate lines to which ninth to twelfth gate signals GW9 to GW12 are applied may be a third gate line group and thirteenth to sixteenth gate lines to which thirteenth to sixteenth gate signals GW13 to GW16 are applied may be a fourth gate line group. For example, the first gate line group, the second gate line group, the third gate line group, and the fourth gate line group may be gate line groups GLG1, GLG2, GLG3, GLG4 of FIG. 3.

However, the present inventive concept may not be limited to the number of the gate lines included in the gate line group.

In addition, in FIGS. 8A to 8C, a 1-1 touch electrode may correspond to the first gate line group, a 1-2 touch electrode may correspond to the second gate line group, a 1-3 touch electrode may correspond to the third gate line group, a 1-4 touch electrode may correspond to the fourth gate line group. In an embodiment, the 1-1 touch electrode, the 1-2 touch electrode, the 1-3 touch electrode, and the 1-4 touch electrode may be the first touch electrodes TE11, TE12, TE13, TE14 of FIG. 3. A touch electrode corresponds to a gate line group by overlapping the gate line group in a plan view. For example, referring to FIG. 3, the 1-1 touch electrode TE11, the 1-2 touch electrode TE12, the 1-3 touch electrode TE13, and the 1-4 touch electrode TE14 may correspond to the first gate line group GLG1, the second gate line group GLG2, the third gate line group GLG3, and the fourth gate line group GLG4 by overlapping the first gate line group GLG1, the second gate line group GLG2, the third gate line group GLG3, and the fourth gate line group GLG4, respectively, in plan view. A first touch driving signal TD1 is applied to the 1-1 touch electrode, a second touch driving signal TD2 is applied to the 1-2 touch electrode, a third touch driving signal TD3 is applied to the 1-3 touch electrode and a fourth touch driving signal TD4 is applied to the 1-4 touch electrode.

As shown in FIGS. 8A to 8C, when first gate pulses are applied to the first gate line group (e.g. the first to fourth gate lines) of the display panel 100 (in a scanning period ST1), the first touch driving signal TD1 applied to the 1-1 touch electrode corresponding to the first gate line group (e.g. the first to fourth gate lines) among the first touch electrodes may have a discharging period.

In addition, when second gate pulses are applied to the second gate line group (e.g. the fifth to eighth gate lines) of the display panel 100 which is adjacent to the first gate line group (e.g. the first to fourth gate lines) (in a scanning period ST2), the second touch driving signal TD2 applied to the 1-2 touch electrode corresponding to the second gate line group (e.g. the fifth to eighth gate lines) among the first touch electrodes may have a discharging period.

In addition, when third gate pulses are applied to the third gate line group (e.g. the ninth to twelfth gate lines) of the display panel 100 which is adjacent to the second gate line group (e.g. the fifth to eighth gate lines) (in a scanning period ST3), the third touch driving signal TD3 applied to the 1-3 touch electrode corresponding to the third gate line group (e.g. the ninth to twelfth gate lines) among the first touch electrodes may have a discharging period.

In addition, when fourth gate pulses are applied to the fourth gate line group (e.g. the thirteenth to sixteenth gate lines) of the display panel 100 which is adjacent to the third gate line group (e.g. the ninth to twelfth gate lines) (in a scanning period ST4), the fourth touch driving signal TD4 applied to the 1-4 touch electrode corresponding to the fourth gate line group (e.g. the thirteenth to sixteenth gate lines) among the first touch electrodes may have a discharging period.

In FIG. 8A, a length of one discharging period of an X-th touch driving signal may be substantially the same as a length of a scanning period of an X-th gate line group. Herein, X is a positive integer. The length of one discharging period of the first touch driving signal TD1 may be substantially the same as a length of a scanning period ST1 of the first gate line group. The length of one discharging period of the second touch driving signal TD2 may be substantially the same as a length of a scanning period ST2 of the second gate line group.

In FIG. 8A, the first gate pulses may be applied to the first gate line group in the first scanning period ST1, the second gate pulses may be applied to the second gate line group in the second scanning period ST2, the third gate pulses may be applied to the third gate line group in the third scanning period ST3 and the fourth gate pulses may be applied to the fourth gate line group in the fourth scanning period ST4.

In the first scanning period ST1 of FIG. 8A, the first touch driving signal TD1 applied to the 1-1 touch electrode corresponding to the first gate line group may have a discharging period, the second touch driving signal TD2 applied to the 1-2 touch electrode corresponding to the second gate line group may have a charging period, the third touch driving signal TD3 applied to the 1-3 touch electrode corresponding to the third gate line group may have a discharging period and the fourth touch driving signal TD4 applied to the 1-4 touch electrode corresponding to the fourth gate line group may have a charging period.

In the second scanning period ST2 of FIG. 8A, the first touch driving signal TD1 may have a charging period, the second touch driving signal TD2 may have a discharging period, the third touch driving signal TD3 may have a charging period and the fourth touch driving signal TD4 may have a discharging period.

In the third scanning period ST3 of FIG. 8A, the first touch driving signal TD1 may have a discharging period, the second touch driving signal TD2 may have a charging period, the third touch driving signal TD3 may have a discharging period and the fourth touch driving signal TD4 may have a charging period.

In the fourth scanning period ST4 of FIG. 8A, the first touch driving signal TD1 may have a charging period, the second touch driving signal TD2 may have a discharging period, the third touch driving signal TD3 may have a charging period and the fourth touch driving signal TD4 may have a discharging period.

In FIG. 8B, a discharging period of an X-th touch driving signal may correspond to a scanning period of an X-th gate line group and a scanning period of an X+1-th gate line group. Herein, X is a positive integer. A discharging period of the first touch driving signal TD1 may correspond to the scanning period ST1 of the first gate line group and the scanning period ST2 of the second gate line group. A discharging period of the second touch driving signal TD2 may correspond to the scanning period ST2 of the second gate line group and the scanning period ST3 of the third gate line group.

In FIG. 8B, the first gate pulses may be applied to the first gate line group in the first scanning period ST1, the second gate pulses may be applied to the second gate line group in the second scanning period ST2, the third gate pulses may be applied to the third gate line group in the third scanning period ST3 and the fourth gate pulses may be applied to the fourth gate line group in the fourth scanning period ST4.

In the first scanning period ST1 of FIG. 8B, the first touch driving signal TD1 applied to the 1-1 touch electrode corresponding to the first gate line group may have a discharging period, the second touch driving signal TD2 applied to the 1-2 touch electrode corresponding to the second gate line group may have a charging period, the third touch driving signal TD3 applied to the 1-3 touch electrode corresponding to the third gate line group may have a charging period and the fourth touch driving signal TD4 applied to the 1-4 touch electrode corresponding to the fourth gate line group may have a discharging period.

In the second scanning period ST2 of FIG. 8B, the first touch driving signal TD1 may have a discharging period, the second touch driving signal TD2 may have a discharging period, the third touch driving signal TD3 may have a charging period and the fourth touch driving signal TD4 may have a charging period.

In the third scanning period ST3 of FIG. 8B, the first touch driving signal TD1 may have a charging period, the second touch driving signal TD2 may have a discharging period, the third touch driving signal TD3 may have a discharging period and the fourth touch driving signal TD4 may have a charging period.

In the fourth scanning period ST4 of FIG. 8B, the first touch driving signal TD1 may have a charging period, the second touch driving signal TD2 may have a charging period, the third touch driving signal TD3 may have a discharging period and the fourth touch driving signal TD4 may have a discharging period.

In FIG. 8C, a discharging period of an X-th touch driving signal may correspond to a scanning period of an X−1-th gate line group and a scanning period of an X-th gate line group. Herein, X is a positive integer greater than one. A discharging period of the second touch driving signal TD2 may correspond to the scanning period ST1 of the first gate line group and the scanning period ST2 of the second gate line group. A discharging period of the third touch driving signal TD3 may correspond to the scanning period ST2 of the second gate line group and the scanning period ST3 of the third gate line group.

In FIG. 8C, the first gate pulses may be applied to the first gate line group in the first scanning period ST1, the second gate pulses may be applied to the second gate line group in the second scanning period ST2, the third gate pulses may be applied to the third gate line group in the third scanning period ST3 and the fourth gate pulses may be applied to the fourth gate line group in the fourth scanning period ST4.

In the first scanning period ST1 of FIG. 8C, the first touch driving signal TD1 applied to the 1-1 touch electrode corresponding to the first gate line group may have a discharging period, the second touch driving signal TD2 applied to the 1-2 touch electrode corresponding to the second gate line group may have a discharging period, the third touch driving signal TD3 applied to the 1-3 touch electrode corresponding to the third gate line group may have a charging period and the fourth touch driving signal TD4 applied to the 1-4 touch electrode corresponding to the fourth gate line group may have a charging period.

In the second scanning period ST2 of FIG. 8C, the first touch driving signal TD1 may have a charging period, the second touch driving signal TD2 may have a discharging period, the third touch driving signal TD3 may have a discharging period and the fourth touch driving signal TD4 may have a charging period.

In the third scanning period ST3 of FIG. 8C, the first touch driving signal TD1 may have a charging period, the second touch driving signal TD2 may have a charging period, the third touch driving signal TD3 may have a discharging period and the fourth touch driving signal TD4 may have a discharging period.

In the fourth scanning period ST4 of FIG. 8C, the first touch driving signal TD1 may have a discharging period, the second touch driving signal TD2 may have a charging period, the third touch driving signal TD3 may have a charging period and the fourth touch driving signal TD4 may have a discharging period.

Figure 9:
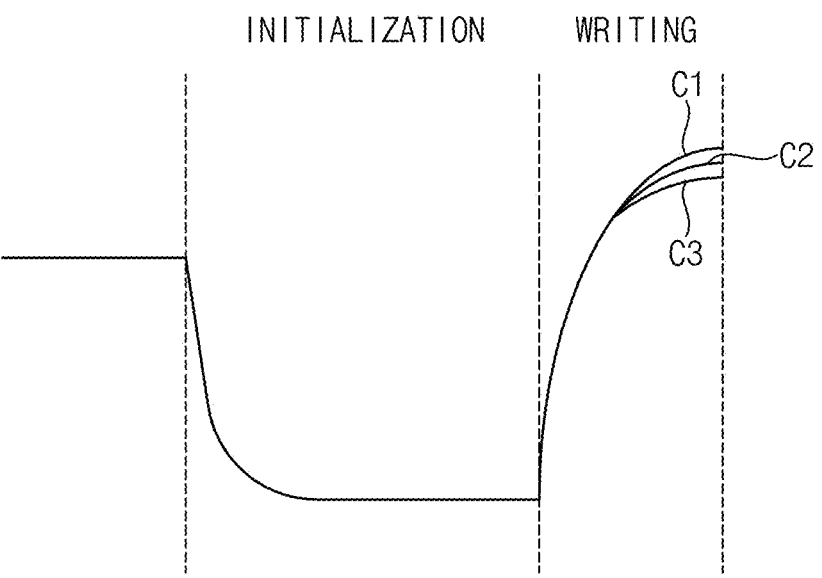
FIG. 9 is a graph illustrating a charging rate of a data voltage according to a comparative embodiment.
Figure 10:
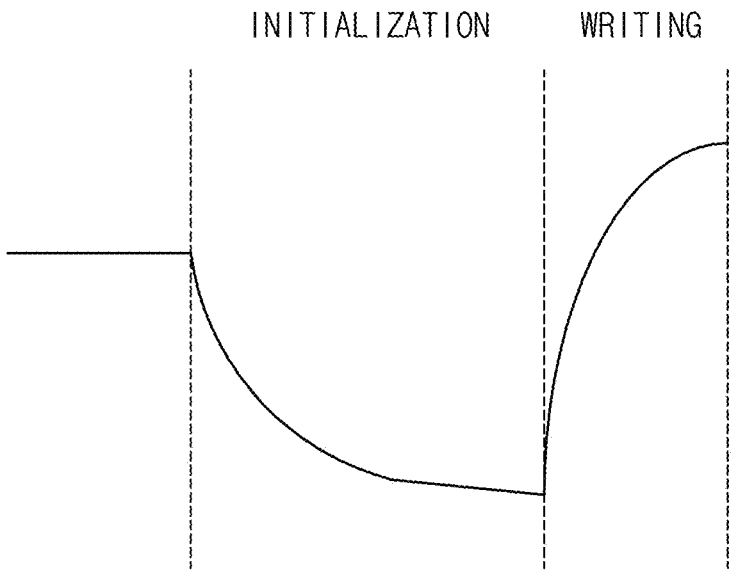
FIG. 10 is a graph illustrating a charging rate of a data voltage according to the present embodiment.

FIG. 9 is a graph illustrating a charging rate of a data voltage according to a comparative embodiment. FIG. 10 is a graph illustrating a charging rate of a data voltage according to the present embodiment.

As shown in FIG. 9, in a conventional display apparatus, the touch driving signal and the data voltage may be coupled. In the conventional display apparatus, a writing period of the data voltage (a scanning period of the scan signal) may be overlapped with a charging period of the touch driving signal. Thus, in the conventional display apparatus, a degree of coupling between the touch driving signal and the data voltage may vary according to a position in the display panel 100 by a waveform of the touch driving signal.

In FIG. 9, C1 represents a charging rate of a data voltage charged in a first pixel, C2 represents a charging rate of a data voltage charged in a second pixel and C3 represents a charging rate of a data voltage charged in a third pixel.

The charging rate of the first pixel, the charging rate of the second pixel and the charging rate of the third pixel may vary by the waveform of the touch driving signal at an end portion of the writing period of the data voltage.

When the degree of the coupling between the touch driving signal and the data voltage varies according to the position in the display panel 100, a horizontal line defect or a stain on the display panel 100 may be shown to a user.

As shown in FIG. 10, in the display apparatus of the present embodiment, the writing period of the data voltage (the scanning period of the gate signal) may be overlapped with the discharging period of the touch driving signal so that the degree of the coupling between the touch driving signal and the data voltage may not vary by the waveform of the touch driving signal (since the touch driving signal maintains a uniform voltage in the discharging period). The degree of the coupling between the touch driving signal and the data voltage does not vary according to the position in the display panel 100 so that the horizontal line defect and the stain on the display panel 100 may be reduced or prevented.

Figure 11A:
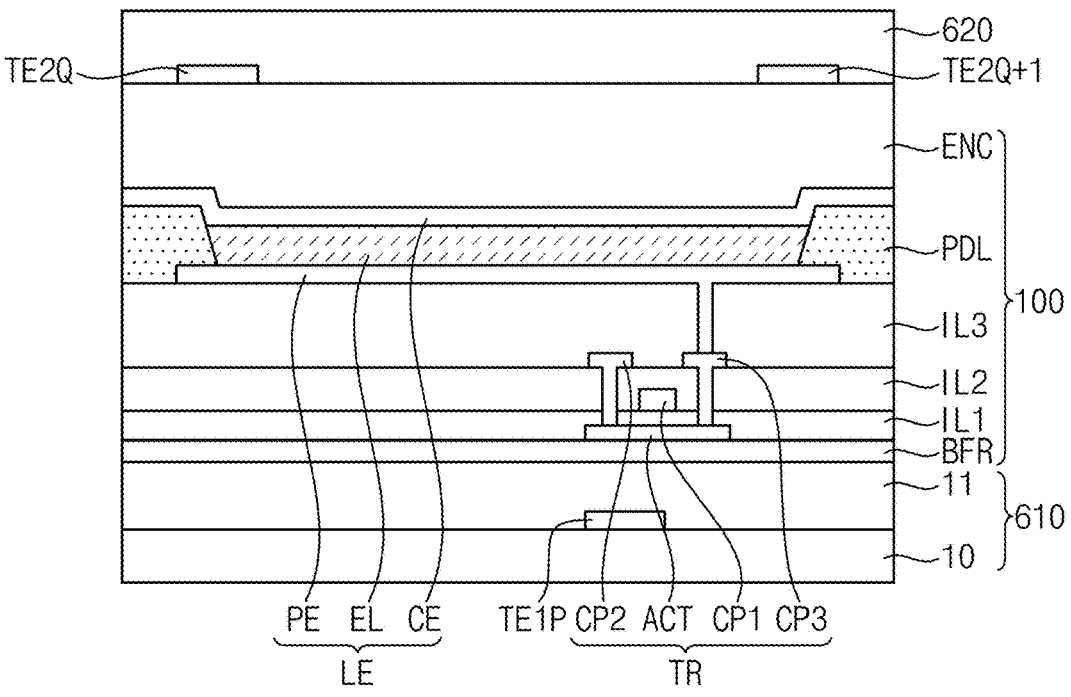
FIG. 11A is a cross-sectional view illustrating relative positions of a gate electrode and a source electrode of a driving switching element of the display panel of FIG. 2 and the first touch electrode of FIG. 3.
Figure 11B:
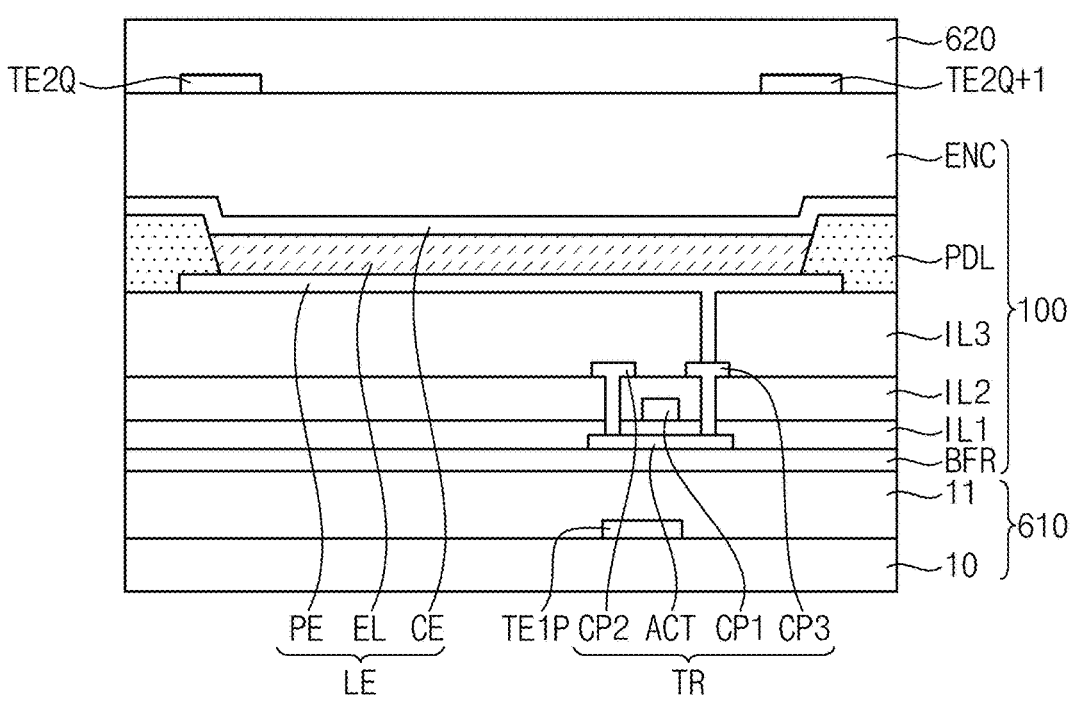
FIG. 11B is a cross-sectional view illustrating relative positions of the gate electrode and the source electrode of the driving switching element of the display panel of FIG. 2 and the first touch electrode of FIG. 3.
Figures 11C, 12:
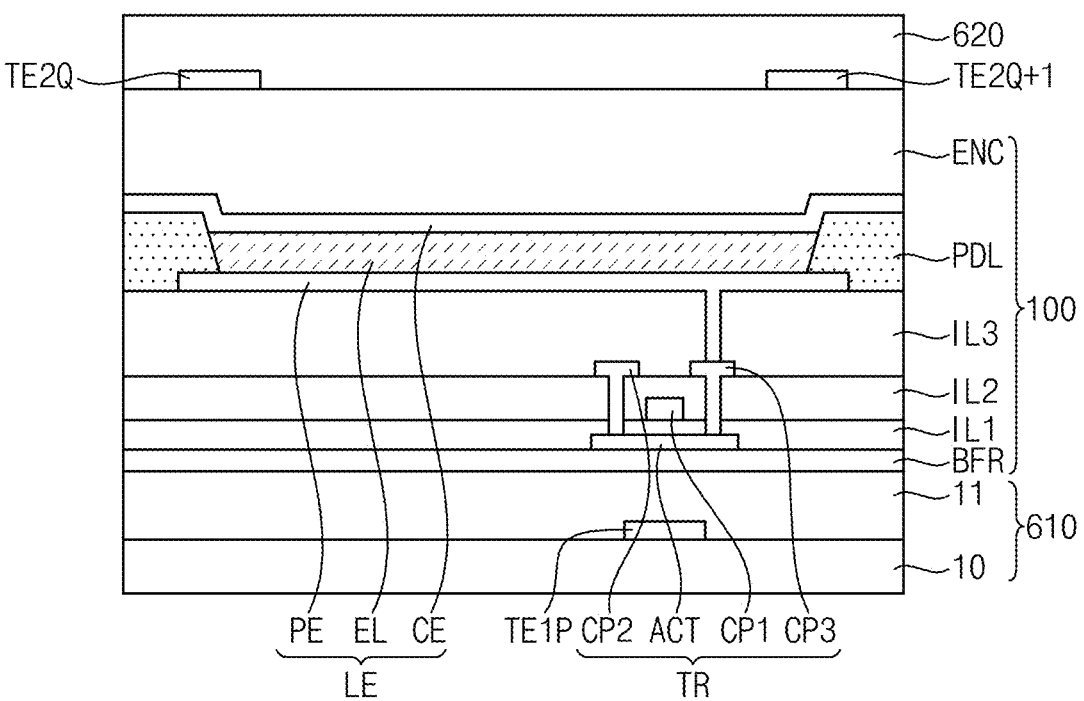
FIG. 11C is a cross-sectional view illustrating relative positions of the gate electrode and the source electrode of the driving switching element of the display panel of FIG. 2 and the first touch electrode of FIG. 3.
FIG. 12 is table illustrating a luminance difference according to an amplitude of the touch driving signal applied to the first touch electrode of FIG. 3 and a luminance difference according to a phase difference of the touch driving signal in the comparative embodiment and the present embodiment.

FIG. 11A is a cross-sectional view illustrating relative positions of a gate electrode and a source electrode of a driving switching element TR of the display panel 100 of FIG. 2 and the first touch electrode TE1P of FIG. 3. FIG. 11B is a cross-sectional view illustrating relative positions of the gate electrode and the source electrode of the driving switching element TR of the display panel 100 of FIG. 2 and the first touch electrode TE1P of FIG. 3. FIG. 11C is a cross-sectional view illustrating relative positions of the gate electrode and the source electrode of the driving switching element TR of the display panel 100 of FIG. 2 and the first touch electrode TE1P of FIG. 3.

The first touch electrode TE1P is disposed at a first position in FIG. 11A, the first touch electrode TE1P is disposed at a second position in FIG. 11B and the first touch electrode TE1P is disposed at a third position in FIG. 11C.

When the position of the first touch electrode TE1P is changed in FIGS. 11A to 11C, a relative position of the gate electrode CP1 and the source electrode CP2 of the driving switching element TR of the display panel 100 and the first touch electrode TE1P may be changed. Accordingly, a capacitance between the first touch electrode TE1P and the gate electrode CP1 and a capacitance between the first touch electrode TE1P and the source electrode CP2 may be changed.

When the capacitance between the first touch electrode TE1P and the gate electrode CP1 of the driving switching element TR of the pixel is different from the capacitance between the first touch electrode TE1P and the source electrode CP2 of the driving switching element TR of the pixel, a luminance difference may be generated between the pixels so that a flicker may be shown to the user.

In the present embodiment, a first ratio of a total capacitance of the gate electrode CP1 of the driving switching element TR and a capacitance between the first touch electrode TE1P and the gate electrode CP1 may be substantially the same as a second ratio of a total capacitance of the source electrode CP2 of the driving switching element TR and a capacitance between the first touch electrode TE1P and the source electrode CP2.

When the first ratio of the total capacitance of the gate electrode CP1 of the driving switching element TR and the capacitance between the first touch electrode TE1P and the gate electrode CP1 is the same as the second ratio of the total capacitance of the source electrode CP2 of the driving switching element TR and the capacitance between the first touch electrode TE1P and the source electrode CP2, a gate-source voltage VGS of the driving switching element TR may be maintained uniformly even though the voltage applied to the first touch electrode TE1P is changed. Accordingly, the flicker of the display panel 100 may be reduced or prevented.

FIG. 12 is table illustrating a luminance difference according to an amplitude of the touch driving signal applied to the first touch electrode of FIG. 3 and a luminance difference according to a phase difference of the touch driving signal in the comparative embodiment and the present embodiment.

Referring to FIGS. 1 to 12, in the display apparatus of the present embodiment, the writing period of the data voltage (the scanning period of the gate signal) is overlapped with the discharging period of the touch driving signal so that the degree of the coupling between the touch driving signal and the data voltage may not vary by the waveform of the touch driving signal. Thus, a luminance difference of the display panel 100 due to a phase difference of the touch driving signal may be reduced.

For example, the luminance difference of the display panel 100 due to the phase difference of the touch driving signal may be 28.1% in the comparative embodiment and the luminance difference of the display panel 100 due to the phase difference of the touch driving signal may be 0% in the present embodiment.

In addition, the first ratio of the total capacitance of the gate electrode CP1 of the driving switching element TR and the capacitance between the first touch electrode TE1P and the gate electrode CP1 may be substantially the same as the second ratio of the total capacitance of the source electrode CP2 of the driving switching element TR and the capacitance between the first touch electrode TE1P and the source electrode CP2 in the display apparatus of the present embodiment. Thus, the luminance difference of the display panel 100 due to an amplitude of the touch driving signal may be reduced.

For example, the luminance difference of the display panel 100 due to the amplitude of the touch driving signal may be 2.7% in the comparative embodiment and the luminance difference of the display panel 100 due to amplitude of the touch driving signal may be 1.8% in the present embodiment.

For example, a sum of the luminance difference of the display panel 100 due to the phase difference of the touch driving signal and the luminance difference of the display panel 100 due to the amplitude of the touch driving signal may be 30.8% in the comparative embodiment and a sum of the luminance difference of the display panel 100 due to the phase difference of the touch driving signal and the luminance difference of the display panel 100 due to the amplitude of the touch driving signal may be 1.8% in the present embodiment.

According to the present embodiment, the horizontal line defect of the display panel 100 and the stain of the display panel 100 may be reduced by overlapping the gate pulse applying period of the gate signal and the discharging period of the touch driving signal in the corresponding area. Thus, the display quality of the display panel 100 may be enhanced.

In addition, the flicker of the display panel 100 may be reduced by matching the ratio of the capacitance between the gate electrode CP1 of the driving switching element TR of the pixel and the first touch electrode TE1P to the total capacitance of the gate electrode CP1 of the driving switching element TR of the pixel and the ratio of the capacitance between the source electrode CP2 of the driving switching element TR of the pixel and the first touch electrode TE1P to the total capacitance of the source electrode CP2 of the driving switching element TR of the pixel. Thus, the display quality of the display panel 100 may be enhanced.

Figure 13:
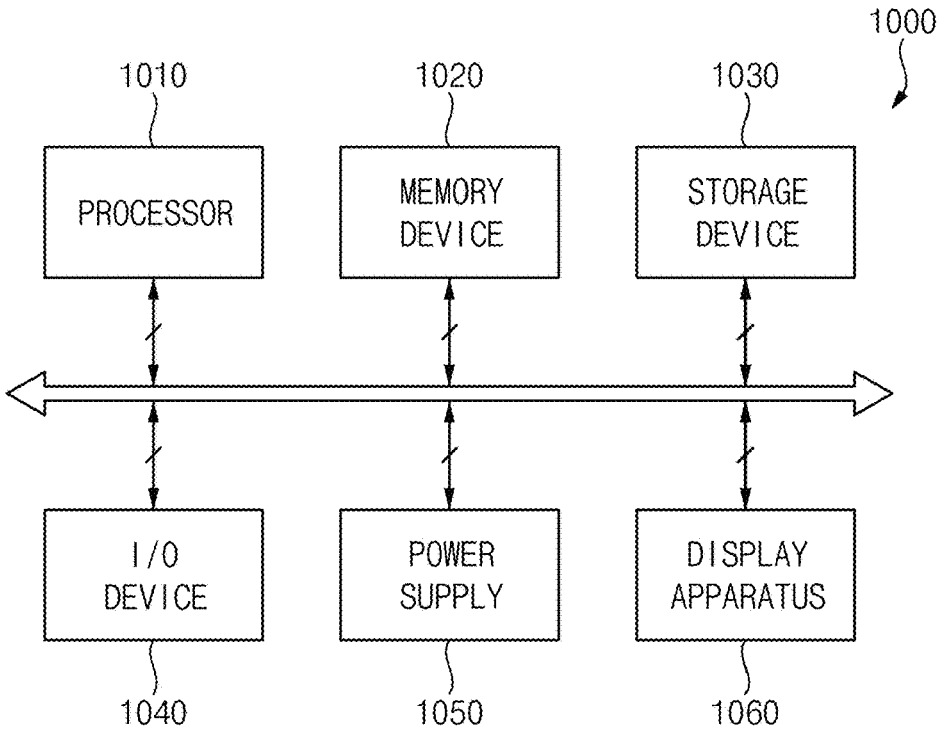
FIG. 13 is a block diagram illustrating an electronic apparatus according to an embodiment of the present inventive concept.
Figure 14:
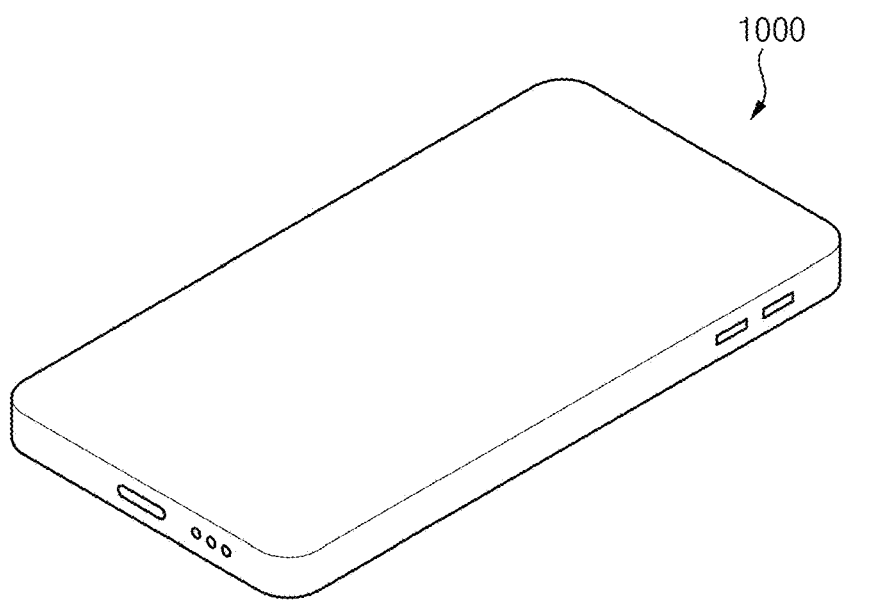
FIG. 14 is a diagram illustrating an example in which the electronic apparatus of FIG. 13 is implemented as a smart phone.

FIG. 13 is a block diagram illustrating an electronic apparatus according to an embodiment of the present inventive concept. FIG. 14 is a diagram illustrating an example in which the electronic apparatus of FIG. 13 is implemented as a smart phone.

Referring to FIGS. 13 and 14, the electronic apparatus 1000 may include a processor 1010, a memory device 1020, a storage device 1030, an input/output (I/O) device 1040, a power supply 1050, and a display apparatus 1060. Here, the display apparatus 1060 may be the display apparatus of FIG. 1. In addition, the electronic apparatus 1000 may further include a plurality of ports for communicating with a video card, a sound card, a memory card, a universal serial bus (USB) device, other electronic apparatuses, etc.

In an embodiment, as illustrated in FIG. 14, the electronic apparatus 1000 may be implemented as a smart phone. However, the electronic apparatus 1000 is not limited thereto. For example, the electronic apparatus 1000 may be implemented as a cellular phone, a video phone, a smart pad, a smart watch, a tablet PC, a car navigation system, a computer monitor, a laptop, a head mounted display (HMD) device, and the like.

The processor 1010 may perform various computing functions or various tasks. The processor 1010 may be a micro-processor, a central processing unit (CPU), an application processor (AP), and the like. The processor 1010 may be coupled to other components via an address bus, a control bus, a data bus, etc. Further, the processor 1010 may be coupled to an extended bus such as a peripheral component interconnection (PCI) bus.

The processor 1010 may output the input image data IMG and the input control signal CONT to the driving controller 200 of FIG. 1.

The memory device 1020 may store data for operations of the electronic apparatus 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or at least one volatile memory device such as a dynamic random access memory (DRAM) device, a static random access memory (SRAM) device, a mobile DRAM device, and the like.

The storage device 1030 may include a solid state drive (SSD) device, a hard disk drive (HDD) device, a CD-ROM device, and the like. The I/O device 1040 may include an input device such as a keyboard, a keypad, a mouse device, a touch-pad, a touch-screen, and the like and an output device such as a printer, a speaker, and the like. In some embodiments, the display apparatus 1060 may be included in the I/O device 1040. The power supply 1050 may provide power for operations of the electronic apparatus 1000. The display apparatus 1060 may be coupled to other components via the buses or other communication links.

According to the display apparatus and the method of driving the display apparatus in the present inventive concept, the display quality of the display panel may be enhanced.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A display apparatus comprising:
   a display panel;
   a gate driver configured to output gate signals to the display panel;
   a data driver configured to output data voltages to the display panel;
   a first touch layer disposed adjacent to the display panel and including a plurality of first touch electrodes;
   a second touch layer disposed adjacent to the display panel and including a plurality of second touch electrodes; and
   a touch driver configured to output touch driving signals to the plurality of first touch electrodes,
   wherein when first gate pulses are applied to a first gate line group of the display panel, a first touch driving signal applied to a 1-1 touch electrode overlapping the first gate line group among the plurality of first touch electrodes has a discharging period, and
   wherein when second gate pulses are applied to a second gate line group of the display panel which is adjacent to the first gate line group, a second touch driving signal applied to a 1-2 touch electrode overlapping the second gate line group among the plurality of first touch electrodes has a discharging period.

2. The display apparatus of claim 1, wherein a plurality of gate lines of the display panel extends in a first direction, wherein the plurality of first touch electrodes extends in the first direction, wherein gate pulses are sequentially applied to the plurality of gate lines along a second direction, and wherein the touch driving signals are sequentially applied to the plurality of first touch electrodes along the second direction.

3. The display apparatus of claim 2, wherein a plurality of data lines of the display panel extends in the second direction, and wherein the plurality of second touch electrodes extends in the second direction.

4. The display apparatus of claim 1, wherein the touch driving signals periodically have a charging period and a discharging period.

5. The display apparatus of claim 1, wherein the gate signals and the touch driving signals are synchronized with each other based on a vertical start signal.

6. The display apparatus of claim 5, further comprising a driving controller configured to control the gate driver and the data driver, wherein the driving controller is configured to output the vertical start signal to the gate driver and the touch driver.

7. The display apparatus of claim 1, wherein the first gate pulses are applied to the first gate line group in a first scanning period, wherein the second gate pulses are applied to the second gate line group adjacent to the first gate line group in a second scanning period, wherein third gate pulses are applied to a third gate line group adjacent to the second gate line group in a third scanning period, wherein fourth gate pulses are applied to a fourth gate line group adjacent to the third gate line group in a fourth scanning period, wherein, in the first scanning period, the first touch driving signal applied to the 1-1 touch electrode overlapping the first gate line group has a discharging period, the second touch driving signal applied to the 1-2 touch electrode overlapping the second gate line group has a charging period, a third touch driving signal applied to a 1-3 touch electrode overlapping the third gate line group has a discharging period and a fourth touch driving signal applied to a 1-4 touch electrode overlapping the fourth gate line group has a charging period, wherein, in the second scanning period, the first touch driving signal has a charging period, the second touch driving signal has a discharging period, the third touch driving signal has a charging period and the fourth touch driving signal has a discharging period, wherein, in the third scanning period, the first touch driving signal has a discharging period, the second touch driving signal has a charging period, the third touch driving signal has a discharging period and the fourth touch driving signal has a charging period, and wherein, in the fourth scanning period, the first touch driving signal has a charging period, the second touch driving signal has a discharging period, the third touch driving signal has a charging period and the fourth touch driving signal has a discharging period.

8. The display apparatus of claim 1, wherein the first gate pulses are applied to the first gate line group in a first scanning period, wherein the second gate pulses are applied to the second gate line group adjacent to the first gate line group in a second scanning period, wherein third gate pulses are applied to a third gate line group adjacent to the second gate line group in a third scanning period, wherein fourth gate pulses are applied to a fourth gate line group adjacent to the third gate line group in a fourth scanning period, wherein, in the first scanning period, the first touch driving signal applied to the 1-1 touch electrode overlapping the first gate line group has a discharging period, the second touch driving signal applied to the 1-2 touch electrode overlapping the second gate line group has a charging period, a third touch driving signal applied to a 1-3 touch electrode overlapping the third gate line group has a charging period and a fourth touch driving signal applied to a 1-4 touch electrode overlapping the fourth gate line group has a discharging period, wherein, in the second scanning period, the first touch driving signal has a discharging period, the second touch driving signal has a discharging period, the third touch driving signal has a charging period and the fourth touch driving signal has a charging period, wherein, in the third scanning period, the first touch driving signal has a charging period, the second touch driving signal has a discharging period, the third touch driving signal has a discharging period and the fourth touch driving signal has a charging period, and wherein, in the fourth scanning period, the first touch driving signal has a charging period, the second touch driving signal has a charging period, the third touch driving signal has a discharging period and the fourth touch driving signal has a discharging period.

9. The display apparatus of claim 1, wherein the first gate pulses are applied to the first gate line group in a first scanning period, wherein the second gate pulses are applied to the second gate line group adjacent to the first gate line group in a second scanning period, wherein third gate pulses are applied to a third gate line group adjacent to the second gate line group in a third scanning period, wherein fourth gate pulses are applied to a fourth gate line group adjacent to the third gate line group in a fourth scanning period, wherein, in the first scanning period, the first touch driving signal applied to the 1-1 touch electrode overlapping the first gate line group has a discharging period, the second touch driving signal applied to the 1-2 touch electrode overlapping the second gate line group has a discharging period, a third touch driving signal applied to a 1-3 touch electrode overlapping the third gate line group has a charging period and a fourth touch driving signal applied to a 1-4 touch electrode overlapping the fourth gate line group has a charging period, wherein, in the second scanning period, the first touch driving signal has a charging period, the second touch driving signal has a discharging period, the third touch driving signal has a discharging period and the fourth touch driving signal has a charging period, wherein, in the third scanning period, the first touch driving signal has a charging period, the second touch driving signal has a charging period, the third touch driving signal has a discharging period and the fourth touch driving signal has a discharging period, and wherein, in the fourth scanning period, the first touch driving signal has a discharging period, the second touch driving signal has a charging period, the third touch driving signal has a charging period and the fourth touch driving signal has a discharging period.

10. The display apparatus of claim 1, wherein the display panel is disposed on the first touch layer, wherein the second touch layer is disposed on the display panel, and wherein when a touch element contacts the second touch layer, a touch event is generated.

11. A display apparatus comprising:

a display panel including a driving switching element;

a first touch layer disposed adjacent to the display panel and including a plurality of first touch electrodes;

a second touch layer disposed adjacent to the display panel and including a plurality of second touch electrodes; and a touch driver configured to output touch driving signals to the plurality of first touch electrodes, wherein a first ratio of a total capacitance of a gate electrode of the driving switching element and a capacitance between a first touch electrode of the plurality of first touch electrodes and the gate electrode is substantially the same as a second ratio of a total capacitance of a source electrode of the driving switching element and a capacitance between the first touch electrode and the source electrode.

12. The display apparatus of claim 11, further comprising:

a gate driver configured to output gate signals to the display panel; and a data driver configured to output data voltages to the display panel, wherein when first gate pulses are applied to a first gate line group of the display panel, a first touch driving signal applied to a 1-1 touch electrode overlapping the first gate line group among the plurality of first touch electrodes has a discharging period.

13. The display apparatus of claim 12, wherein when second gate pulses are applied to a second gate line group of the display panel which is adjacent to the first gate line group, a second touch driving signal applied to a 1-2 touch electrode overlapping the second gate line group among the plurality of first touch electrodes has a discharging period.

14. The display apparatus of claim 11, wherein a plurality of gate lines of the display panel extends in a first direction, wherein the plurality of first touch electrodes extends in the first direction, wherein gate pulses are sequentially applied to the plurality of gate lines along a second direction, and wherein the touch driving signals are sequentially applied to the plurality of first touch electrodes along the second direction.

15. The display apparatus of claim 11, wherein the display panel is disposed on the first touch layer, wherein the second touch layer is disposed on the display panel, and wherein when a touch element contacts the second touch layer, a touch event is generated.

16. A method of driving a display apparatus, the method comprising:

outputting gate signals to a display panel;

outputting data voltages to the display panel; and outputting touch driving signals to a plurality of first touch electrodes of a first touch layer disposed adjacent to the display panel, wherein when first gate pulses are applied to a first gate line group of the display panel, a first touch driving signal applied to a 1-1 touch electrode overlapping the first gate line group among the plurality of first touch electrodes has a discharging period, and wherein when second gate pulses are applied to a second gate line group of the display panel which is adjacent to the first gate line group, a second touch driving signal applied to a 1-2 touch electrode overlapping the second gate line group among the plurality of first touch electrodes has a discharging period.

17. The method of claim 16, wherein a plurality of gate lines of the display panel extends in a first direction, wherein the plurality of first touch electrodes extends in the first direction, wherein gate pulses are sequentially applied to the plurality of gate lines along a second direction, and wherein the touch driving signals are sequentially applied to the plurality of first touch electrodes along the second direction.

18. The method of claim 16, wherein the gate signals and the touch driving signals are synchronized with each other based on a vertical start signal.

* * * * *